United States Patent [19]

Takagi

[11] Patent Number: 5,651,826
[45] Date of Patent: Jul. 29, 1997

[54] PLASMA PROCESSING APPARATUS

[75] Inventor: Ken-ichi Takagi, Hamura, Japan

[73] Assignee: Anelva Corporation, Tokyo, Japan

[21] Appl. No.: 652,759

[22] Filed: May 23, 1996

[30] Foreign Application Priority Data

May 30, 1995 [JP] Japan .................................. 7-155153

[51] Int. Cl.$^6$ ................................................ C23C 16/00
[52] U.S. Cl. ........................................ 118/724; 118/723 ER
[58] Field of Search ...................... 118/723 E, 723 ER,
118/723 AP, 723 MW, 724; 156/345; 204/298.16,
298.17, 298.18, 298.19, 298.2, 298.21,
298.22, 298.37

[56] References Cited

U.S. PATENT DOCUMENTS

| | | | |
|---|---|---|---|
| 5,079,481 | 1/1992 | Moslehi | 315/111.41 |
| 5,082,542 | 1/1992 | Moslehi | 156/345 |
| 5,122,251 | 6/1992 | Campbell et al. | 204/298.06 |
| 5,286,297 | 2/1994 | Moslehi et al. | 118/723 E |
| 5,290,381 | 3/1994 | Nozawa et al. | 156/345 |
| 5,308,417 | 5/1994 | Groechel et al. | 156/643 |
| 5,324,360 | 6/1994 | Kozuka | 118/719 |
| 5,460,684 | 10/1995 | Saeki et al. | 156/345 |
| 5,545,258 | 8/1996 | Katayama et al. | 118/723 MP |

Primary Examiner—R. Bruce Breneman
Assistant Examiner—Joni Y. Chang
Attorney, Agent, or Firm—Oliff & Berridge

[57] ABSTRACT

A plasma processing apparatus is provided with a plasma generating mechanism including an electric discharge chamber and an annular antenna, a plasma diffusion chamber for diffusing plasma generated by the plasma generating mechanism for processing a substrate, a first temperature adjusting mechanism for adjusting the temperature of the plasma diffusion chamber, a magnetic field generating mechanism arranged around the plasma diffusion chamber to generate a magnetic field in the plasma diffusion chamber, an evacuating mechanism, a gas introducing mechanism, and a substrate holding mechanism. The magnetic field generating mechanism includes permanent magnets and a yoke, and a heat insulating portion is formed between the permanent magnets and the plasma diffusion chamber. A second temperature adjusting mechanism for adjusting the temperature of the permanent magnets is used. The temperature adjustment of the plasma diffusion chamber by the first temperature adjustment mechanism is independent of the temperature adjustment of the permanent magnets by the second temperature adjusting mechanism.

6 Claims, 10 Drawing Sheets

PLASMA PROCESSING APPARATUS

BACKGROUND OF THE INVENTION

1. Field of the Invention

The present invention relates to a plasma processing apparatus, and particularly, to a plasma processing apparatus such as a plasma CVD apparatus or a plasma etching apparatus or the like.

2. Description of the Related Art

An example of the conventional plasma processing apparatus will be explained below by referring to FIGS. 9 and 10. This example shows an inductively coupled plasma processing apparatus. The inductively coupled plasma processing apparatus includes a plasma generating mechanism having an electric discharge chamber 51 made of a dielectric material and an annular antenna In the plasma processing apparatus shown in FIG. 9, there is the above-mentioned annular antenna 52 for introducing radio-frequency electric power into the electric discharge chamber 51. A plasma diffusion chamber 53 is provided under the electric discharge chamber 51 so as to connected with the chamber 51, which is made of a metallic material. A not-illustrated reactive gas introducing mechanism supplies a reactive gas to the electric discharge chamber 51 and further the internal pressure thereof is reduced to 100 Pa or lower. Furthermore, when the annular antenna 52 supplies the radio-frequency electric power, electric discharge occurs in the electric discharge chamber 51 and thereby plasma can be generated. This reactive gas introducing mechanism is well known. Active species included in the plasma diffuse from the electric discharge chamber 51 into the plasma diffusion chamber 53. The active species process the surface of a substrate 55 placed on a substrate holding mechanism 54 in the plasma diffusion chamber 53.

As shown in FIG. 10, a plurality of magnetic circuit sections 56 are arranged at the outer periphery of the plasma diffusion chamber 53 at almost equal intervals. Each of the magnetic circuit sections 56 includes a yoke 57 for forming a magnetic path and two rod-shaped permanent magnets 58 secured to the yoke 57. A plurality of rod-shaped permanent magnets 58 are parallel with the central axis of the plasma diffusion chamber 53 and arranged in pairs which are arranged at equal intervals, and further all of them contact the outside of the plasma diffusion chamber 53. Polarities of adjacent magnets of the plural permanent magnets 58 are different from each other. The magnetic circuit sections 56 generate a magnetic field referred to as "a line cusped magnetic field" along the inside of the plasma diffusion chamber 53. The magnetic circuit sections 56 generate lines of magnetic flux 59 near to the inside of the plasma diffusion chamber 53 and along the inside thereof. The lines of magnetic flux 59 in the plasma diffusion chamber 53 capture charged particles such as electrons and ions in the plasma. Therefore, the number of charged particles colliding with the inside surface of the plasma diffusion chamber 53 is decreased and therefore the number of charged particles which are deactivated is reduced. Therefore, the plasma can efficiently be maintained in the plasma diffusion chamber 53. The lines of magnetic flux 59 generated in the plasma diffusion chamber 53 are referred to as "a bucket magnetic field".

In the conventional plasma processing apparatus shown in FIGS. 9 and 10, a film deposited on the inside of the plasma diffusion chamber 53 produces particles causing contamination. The deposited film causes a problem that the reproducibility of the plasma generated by the plasma generating mechanism is deteriorated. Therefore, the film deposited on the inside of the plasma diffusion chamber 53 has a bad effect on the reproducibility of the plasma processing. To solve this problem, the plasma diffusion chamber 53 is conventionally heated for the plasma processing so that the film is not deposited on the inside of the plasma diffusion chamber 53. Further, a problem solving method has been reported, in which a relative percentage of necessary active species in plasma can be increased by raising the temperature of the inside of the plasma diffusion chamber 53 (e.g. Sugai et al., 41st OYOBUTSURIGAKU KANREN RENGO KOENKAI YOKOSHU Second Separate Volume, p. 536). According to this report, it is estimated that temperature control of the plasma diffusion chamber 53 is an important factor to optimize the plasma processing.

However, since the above conventional apparatus is provided with the magnetic circuit sections 56 contacting the outside of the plasma diffusion chamber 53 in order to efficiently maintain the plasma, the temperature of the magnets 58 of the magnetic circuit sections 56 also rises as the temperature of the plasma diffusion chamber 53 is raised. When the temperature of the magnets 58 rises, demagnetization occurs in comparison with a state thereof at room temperature. Therefore, in the plasma diffusion chamber 53 which has been heated, the plasma confining effect based on the magnetic circuit sections 56 is decreased. By cooling the magnets 58 provided to the plasma diffusion chamber 53 to solve the problem, the temperature of portions of the plasma diffusion chamber 53 corresponding to the magnets 58 is lowered. Accordingly, the temperature of the inside of the plasma diffusion chamber is non-uniformed and thereby films are locally deposited on the inside thereof to cause contamination particles. This is a problem.

SUMMARY OF THE INVENTION

The object of the present invention is to solve the above problems, and further is to provide a plasma processing apparatus capable of reducing contamination particles in a plasma diffusion chamber by means of making the temperature thereof uniform and decreasing films locally deposited on the inside thereof.

Another object of the present invention is to provide a plasma processing apparatus capable of keeping magnets of magnetic circuit sections from being thermally deteriorated by means of independently performing the temperature control of the plasma diffusion chamber for improving the reproducibility of the plasma processing and the temperature control of the magnets.

The present invention is directed to a plasma processing apparatus for achieving the above objects. The plasma processing apparatus of the present invention comprises a plasma generating mechanism including an electric discharge chamber and an annular antenna, a vacuum chamber or plasma diffusion chamber for diffusing the plasma generated by the plasma generating mechanism and thereby processing a substrate, a first temperature adjusting mechanism for adjusting the temperature of the plasma diffusion chamber, a magnetic field generating mechanism arranged around the plasma diffusion chamber for generating a magnetic field nearby the inner surface of the plasma diffusion chamber along the inner surface, an evacuating mechanism for keeping the inside of the plasma diffusion chamber at a reduced pressure, a gas introducing mechanism for introducing gas into at least inside of the electric discharge chamber, and a substrate holding mechanism arranged in the plasma diffusion chamber for holding the substrate. The magnetic field generating mechanism includes permanent magnets and a magnetic path (yoke), and there is a heat insulating portion (portion having a heat insulating effect) between each of the permanent magnets and the plasma diffusion chamber. The plasma processing apparatus is provided with a second temperature adjusting mechanism for adjusting the temperature of the permanent magnets. In the above structure, the temperature adjusting of the plasma diffusion chamber by the first temperature adjusting mechanism is performed independently of the temperature adjusting of the permanent magnets by the second temperature adjusting mechanism. The heat insulating portion formed between the permanent magnets and the plasma diffusion chamber has a structure for keeping the permanent magnets separate from the plasma diffusion chamber or a structure for increasing the distance of a heat conduction path from the plasma diffusion chamber to the permanent magnets.

In the case of the above configuration, when the internal pressure of the electric discharge chamber is first decreased by the evacuating mechanism, a reactive gas is introduced into the electric discharge chamber by the reactive gas introducing mechanism, and radio-frequency electric power is supplied to the electric discharge chamber through the antenna, the reactive gas is activated and plasma is generated in the electric discharge chamber. The plasma generated in the electric discharge chamber diffuses in the plasma diffusion chamber and is supplied to the substrate on the substrate holding mechanism. The surface of the substrate is processed by the plasma. To improve the processing effect at the surface of the substrate by the plasma, the temperature of the plasma diffusion chamber is properly adjusted and controlled by the first temperature adjusting mechanism to generate a bucket magnetic field nearby and along the inner surface of the plasma diffusion chamber, and thereby, charged particles such as electrons and ions in the plasma are captured so as to keep them from being deactivated due to collision in the wall of the plasma diffusion chamber. The permanent magnets of the magnetic field generating mechanism are arranged through the heat insulating portion so that the temperature of the permanent magnets and that of the plasma diffusion chamber do not influence each other. The temperature of the permanent magnets is adjusted and controlled by the second temperature adjusting mechanism independently of the first temperature adjusting mechanism of the plasma diffusion chamber. Thus, the temperature of the plasma diffusion chamber is adjusted to a desired value to control active species necessary for the plasma processing, and simultaneously, the permanent magnets are kept at a proper temperature so that a demagnetized state does not occur in the permanent magnets of the magnetic field generating mechanism.

In the case of the above configuration, the heat insulating portion is formed between the plasma diffusion chamber for performing the plasma processing and the magnetic field generating mechanism for generating a bucket magnetic field in the plasma diffusion chamber so that mutual influence of the temperature of the plasma diffusion chamber and that of the magnetic field generating mechanism is minimized. Further, the first temperature adjusting mechanism for controlling the temperature of the plasma diffusion chamber and the second temperature adjusting mechanism for controlling the temperature of the magnetic field generating mechanism are set so as to control the temperature of the plasma diffusion chamber independently of the temperature of the magnetic field generating mechanism. Therefore, it is possible to decrease the demagnetization of the permanent magnets and uniformly control the temperature of the plasma diffusion chamber to a proper value.

In the above configuration, the temperature of the permanent magnets is preferably kept lower than that of the plasma diffusion chamber. Thereby, it is possible to prevent the magnetic field generation capacity of the permanent magnets from deteriorating.

In the above configuration, another heat insulating portion such as a spacer made of Teflon is preferably arranged between a mechanism for securing the magnetic field generating mechanism and the plasma diffusion chamber. Thereby, it is possible to positively cut off the heat transfer from the plasma diffusion chamber to the magnetic field generating mechanism.

In the above configuration, the magnetic field generating mechanism is preferably arranged in a heat diffusion preventive vessel provided around the plasma diffusion chamber and is secured without contacting the plasma diffusion chamber. It is preferable to hermetically seal the inner space of the heat diffusion preventive vessel in which the magnetic field generating mechanism is arranged.

In the above configuration, the inner space of the heat diffusion preventive vessel is preferably kept at a vacuum state. Thereby, it is possible to prevent heat transfer due to convection.

In the above configuration, the permanent magnets included in the magnetic field generating mechanism are preferably covered with a film for reflecting infrared radiation. Thereby, it is possible to keep the temperature of the permanent magnets from rising due to heat radiation.

DESCRIPTION OF THE PREFERRED EMBODIMENTS

Figure 1:
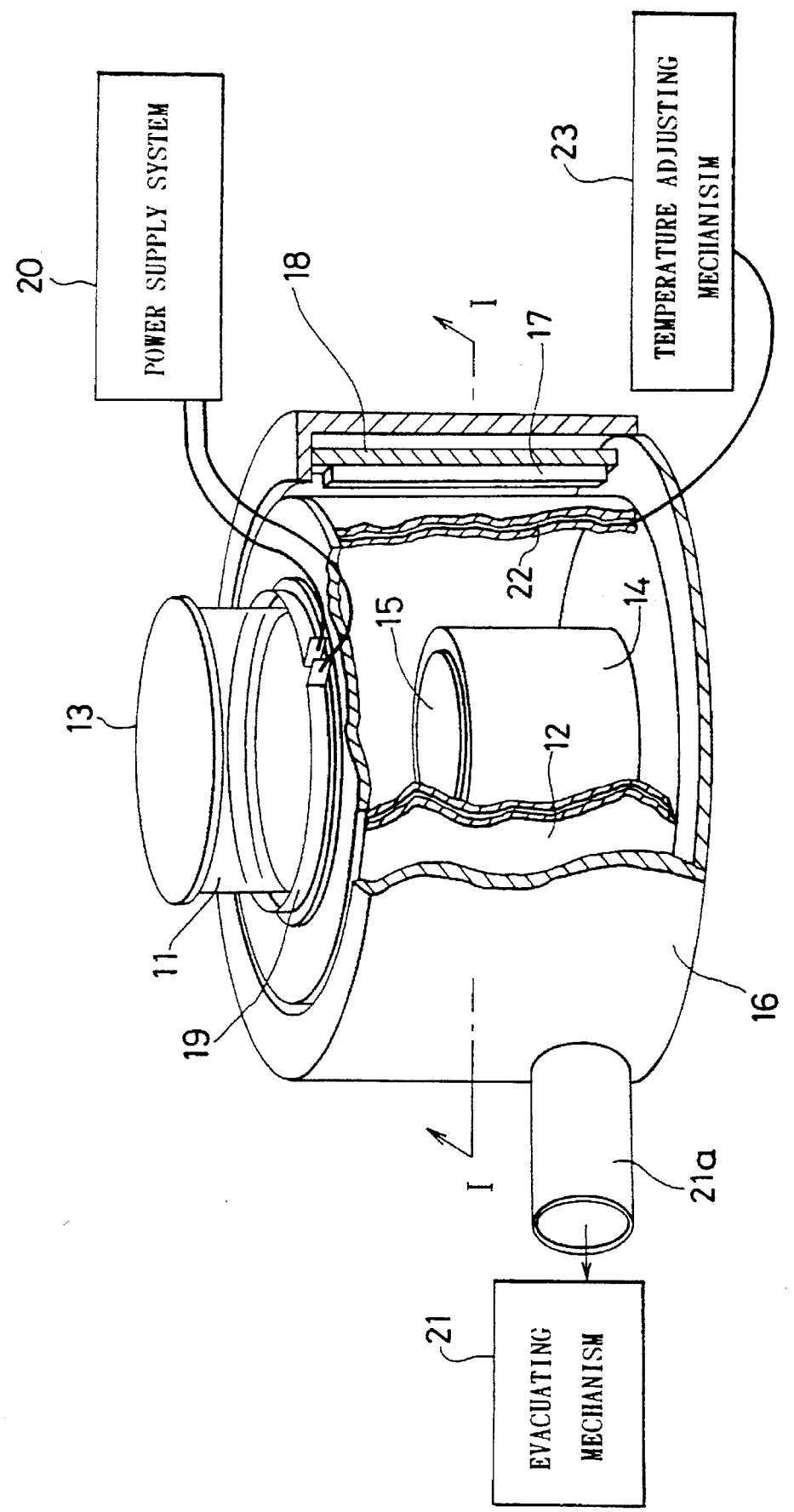
FIG. 1 is a partially cut-out external perspective view showing a first embodiment of a plasma processing apparatus of the present invention.

Hereinafter, preferred embodiments of the present invention will be explained by referring to the accompanying drawings.

A plasma processing apparatus of the first embodiment is an inductively coupled plasma processing apparatus. The plasma processing apparatus includes an electric discharge chamber 11 made of a dielectric and a plasma diffusion chamber 12. The bottom of the electric discharge chamber 11 is opened and connected with the inner space of the plasma diffusion chamber 12. In the case of this embodiment, the side wall of the electric discharge chamber 11 is made of quartz and a top end 13 is a metallic end plate. It is possible to form the whole electric discharge chamber 11 with quartz. A substrate holding mechanism 14 is arranged in the plasma diffusion chamber 12 and a substrate 15 is placed on the substrate holding mechanism 14. The plasma diffusion chamber 12 is enclosed with a heat diffusion preventive vessel 16. The bottom of the heat diffusion preventive vessel 16 is secured to the lower outside of the plasma diffusion chamber 12 and the top of the vessel 16 is formed so as to form a gap between the top of the vessel 16 and the upper outside of the plasma diffusion chamber 12 without contacting the upper outside thereof. A plurality of yokes 18 are arranged around the outer periphery of the plasma diffusion chamber 12 so as not to contact the outside of the chamber 12 and each yoke is provided with two rod-shaped permanent magnets 17. The yoke 18 serves as a magnetic path for lines of magnetic force generated by the two permanent magnets 17. The rod-shaped permanent magnets 17 and the yoke 18 are parallel with the central axis of the plasma diffusion chamber 12. The yoke 18 is suspended from the top wall of the heat diffusion preventive vessel 16. Thereby, the permanent magnets 17 do not contact the outside of the plasma diffusion chamber 12. An annular antenna 19 is arranged around the lower portion of the electric discharge chamber 11. The antenna 19 receives necessary electric power from a power supply system 20. The plasma diffusion chamber 12 is provided with a pipe member 21a connected to an evacuating mechanism 21. When gas is evacuated through the pipe member 21a by the evacuating mechanism 21, the internal pressure of the plasma diffusion chamber 12 and that of the electric discharge chamber 11 are reduced to a desired vacuum state.

To operate the plasma processing apparatus having the above structure, the internal space of the plasma diffusion chamber 12 and that of the electric discharge chamber 11 are evacuated to a desired vacuum state by the evacuating mechanism 21 including an oil-sealed rotary vacuum pump and an oil-sealed diffusion pump. Thereafter, a reactive gas is introduced into the internal spaces through the electric discharge chamber 11 by a well-known reactive-gas introducing mechanism (not shown), and simultaneously suitable evacuation is performed in order to keep the internal spaces at a desirable reduced-pressure state of 100 Pa or lower. Further, the antenna 19 surrounding the electric discharge chamber 11 receiving radio-frequency electric power from a power supply system 20 supplies electric power to the electric discharge chamber 11, and generates plasma based on radio-frequency electric discharge causing particles of the reactive gas to be activated.

The surface of the substrate 15 positioned in the plasma diffusion chamber 12 so as to face the electric discharge chamber 11 is processed by active species in the plasma generated in the electric discharge chamber 11. While the surface of the substrate 15 is processed, the plasma diffusion chamber 12 is kept at a predetermined temperature of, for example, 70° C. or higher by a temperature adjusting mechanism 23 for supplying a heat medium to a heat medium path 22 arranged in the plasma diffusion chamber 12. The predetermined temperature keeps the active species necessary for the plasma processing from getting into contact with the inside surface of the plasma diffusion chamber 53. Because, if the active species touch the inside surface of the plasma diffusion chamber 53, they lose their active energy. The heat medium path 22 serving as a liquid flowing channel, having an inlet and an outlet (not shown), receives a liquid at a proper temperature, that is, the heat medium from the temperature adjusting mechanism 23. The heat medium supplied through a circulator included in the temperature adjusting mechanism 23 can be circulated through the heat medium path 22 in accordance with a temperature condition of the plasma diffusion chamber 12. Further, the heat diffusion preventive vessel 16 arranged around the plasma diffusion chamber 12 prevents the heat of the plasma diffusion chamber 12 given by the heat medium flowing through the heat medium path 21 from escaping to the outside due to convection.

Figure 2:
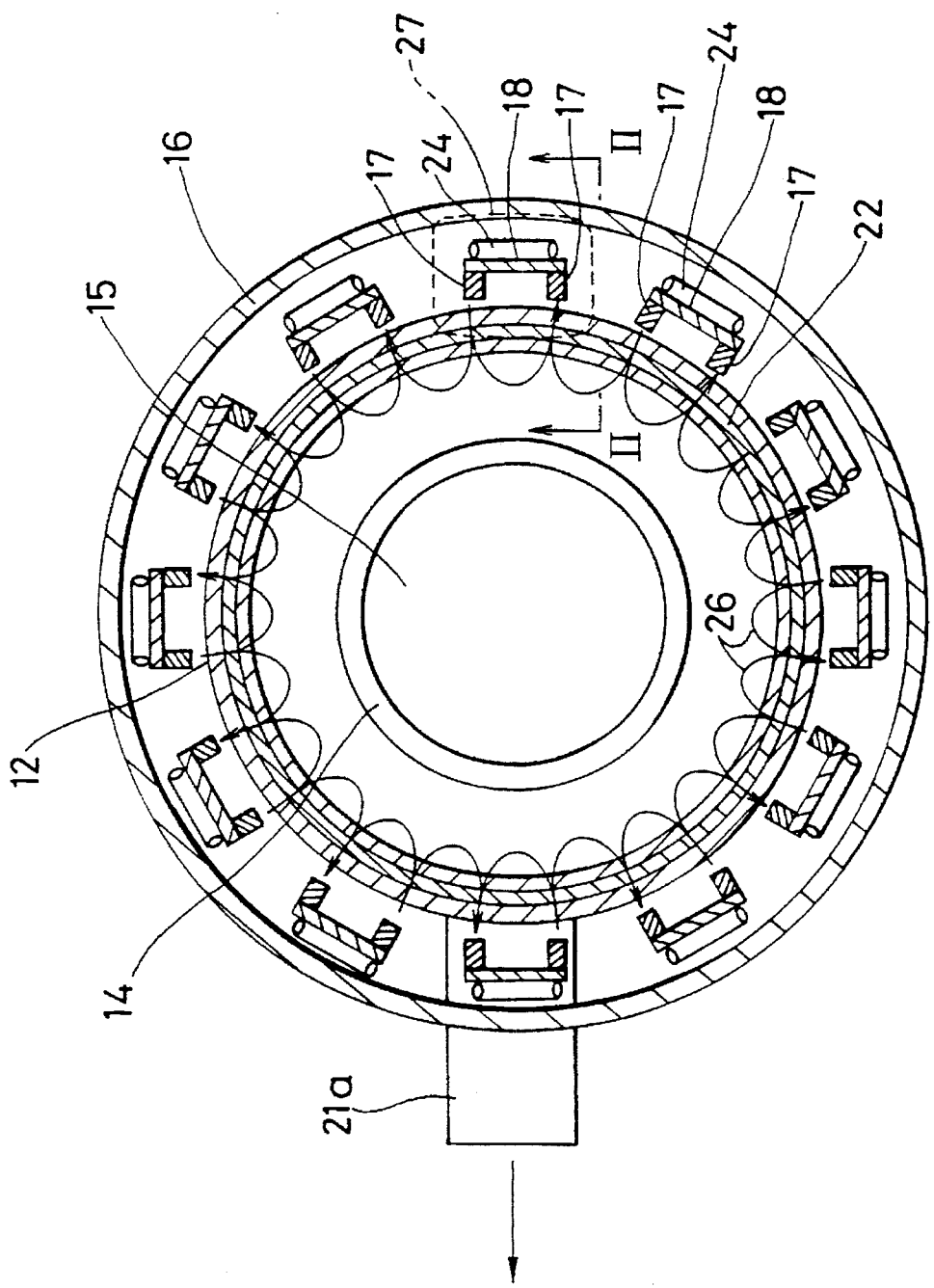
FIG. 2 is a sectional view of a line I—I in FIG. 1.
Figure 3:
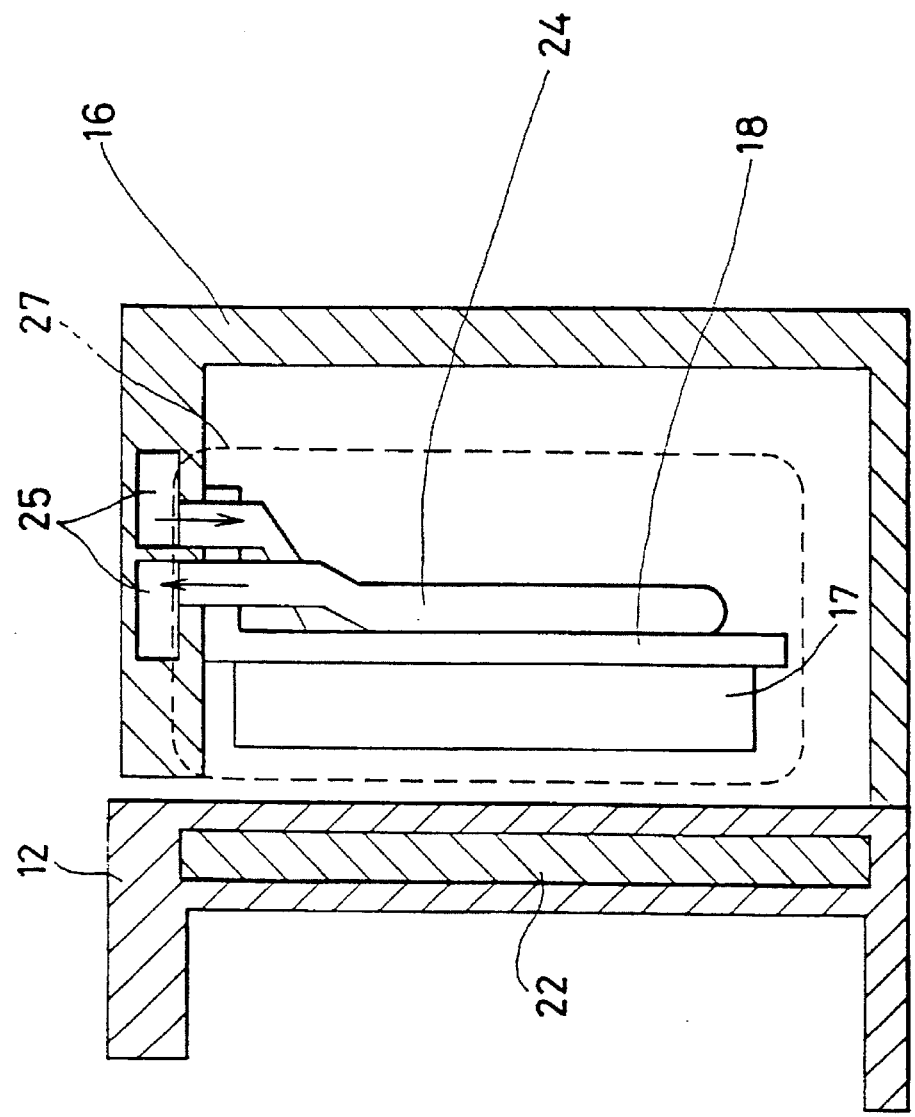
FIG. 3 is a sectional view of a line II—II in FIG. 2.

On the other hand, as shown in FIGS. 2 and 3, the permanent magnets 17 are cooled by a liquid cooling pipe 24 for flowing a coolant arranged on the back of the yoke 18. Further, a cooling path 25 for flowing the coolant is formed on the top wall of the heat diffusion preventive vessel 16 as shown in FIG. 3. A coolant supply device for supplying the coolant to the cooling path 25 and the liquid cooling pipe 24 is not shown. A temperature adjusting mechanism for properly adjusting the temperature of the permanent magnet 17 comprises the liquid cooling pipe 24 of each yoke 18, the cooling path 25, and the coolant supply device.

As shown in FIG. 2, a plurality of rod-shaped permanent magnets 17 are parallel with the central axis of the plasma diffusion chamber 12 and are arranged around the outside of the plasma diffusion chamber 12. Polarities of adjacent permanent magnets 17 are different from each other. A set of the two adjacent permanent magnets 17 generates a magnetic field 26 referred to as a line cusped magnetic field along the inner surface of the plasma diffusion chamber 12.

In FIG. 3, as described above, a magnetic circuit section 27 including the two permanent magnets 17 and the yoke 18 is suspended from the top wall of the heat diffusion preventive vessel 16 and the outer wall-surface of the plasma diffusion chamber 12 does not contact the permanent magnet 17 for the bucket magnetic field. This structure makes it possible to increase a heat conduction path from the plasma diffusion chamber 12 to the permanent magnet 17 via the heat diffusion preventive vessel 16. The plasma diffusion chamber 12 is made of aluminum with a large heat conductivity in order to obtain a preferable uniformity of the temperature of the plasma diffusion chamber 12. On the other hand, the heat diffusion preventive vessel 16 serving as a heat conduction path is made of stainless steel with a small heat conductivity in order to minimize the conduction of the heat from the plasma diffusion chamber 12 to the yoke 18. Therefore, transfer of heat from the plasma diffusion chamber 12 to the permanent magnet 17 is substantially performed by only both air convection and heat radiation. Therefore, cooling at the yoke 18 by the coolant does not easily influence the plasma diffusion chamber 12, and reversely heating at the plasma diffusion chamber 12 does not easily influence the permanent magnet 17.

In accordance with the first embodiment, when it is necessary to raise the temperature of the plasma diffusion chamber 12 for the plasma processing, the effect of the permanent magnet 17 is not deteriorated even if raising the temperature thereof, which is different from the conventional plasma diffusion chamber to which the permanent magnet is directly arranged. Further, the first embodiment makes it possible to realize uniform heating in the plasma diffusion chamber which is different from the conventional plasma diffusion chamber in which the temperature of the portions thereof corresponding to permanent magnets is locally lowered, and thereby the temperature of the plasma diffusion chamber 12 and the temperature of permanent magnets 17 are independently controlled. In addition, it is preferable that the temperature of the permanent magnet 17 is kept lower than that of the plasma diffusion chamber 12.

By forming a film for reflecting infrared radiation on the surface of the rod-shaped permanent magnet 17, it is possible to further reduce any temperature rise of the permanent magnet 17 due to heat radiation.

Though the heat diffusion preventive vessel 16 is secured to the plasma diffusion chamber 12 in the case of the above first embodiment, a heat insulating layer or heat insulating portion also can be similarly formed by securing the heat diffusion preventive vessel 16 to a portion other than the plasma diffusion chamber 12.

Figure 4:
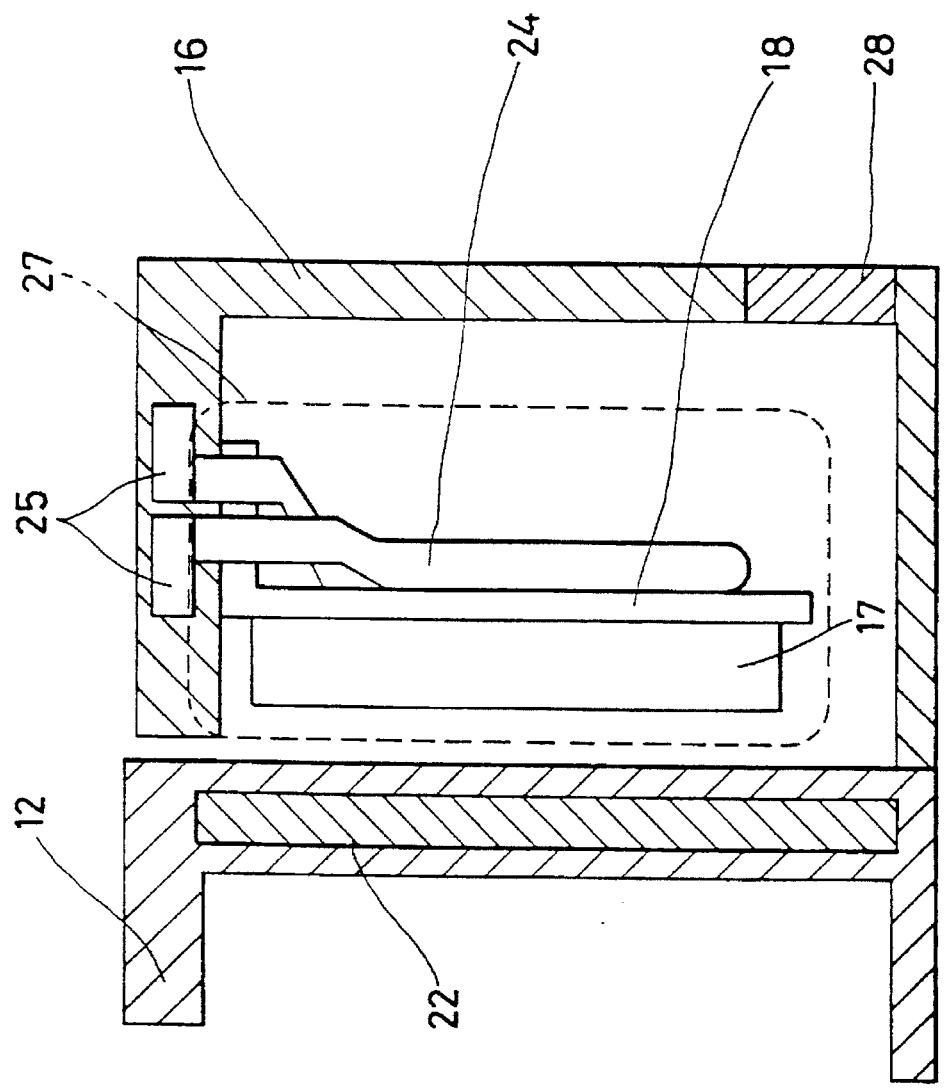
FIG. 4 is a longitudinal section of an essential portion similar to FIG. 3, showing a second embodiment of the present invention.

FIG. 4 shows the second embodiment of the present invention. The second embodiment shows an example in which a spacer 28 made of Teflon with a small heat conductivity is inserted into a part of the heat diffusion preventive vessel 16 of the first embodiment. The second embodiment is characterized by having a structure in which the heat in the heated plasma diffusion chamber 12 is not easily transferred to the yoke 18. Other configurations are the same as that of the first embodiment. Therefore, it is more difficult for the heat of the plasma diffusion chamber 16 to be transferred to the yoke 18, and it is possible to more efficiently control the temperature of the plasma diffusion chamber 12 and the temperature of the permanent magnet 17 independently. Further, the second embodiment makes it possible to keep the temperature of the rod-shaped permanent magnet 17 from rising due to heat radiation by forming a film for reflecting infrared radiation on the surface of the permanent magnet 17 similarly to the case of the first embodiment.

Though the spacer 28 inserted into the heat diffusion preventive vessel 16 is made of Teflon in the case of the above second embodiment, it is possible to use another material for the spacer as long as the material has a heat conductivity smaller than that of the heat diffusion preventive vessel 16.

Figure 5:
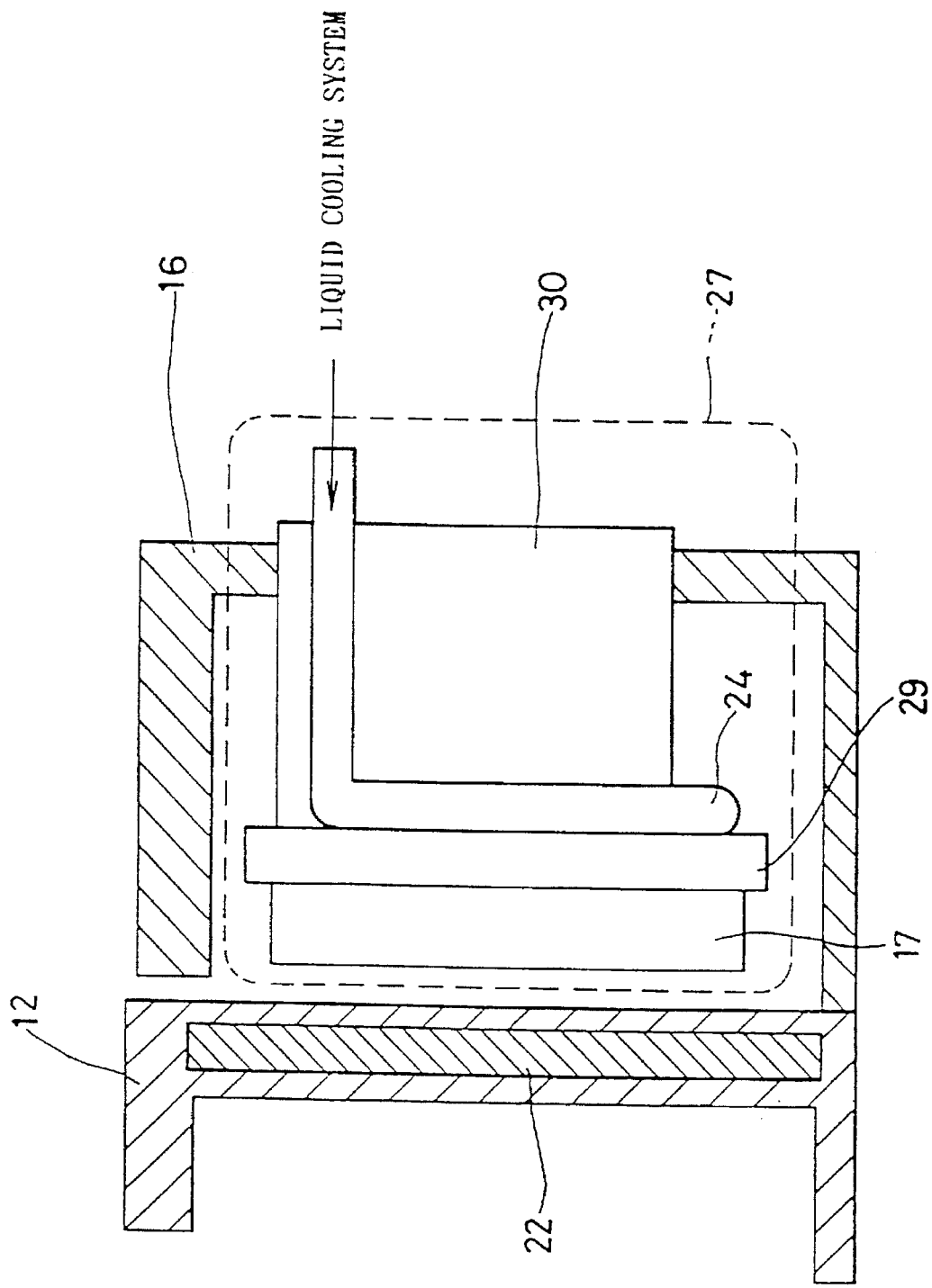
FIG. 5 is a longitudinal section of an essential portion similar to FIG. 3, showing a third embodiment of the present invention.

FIG. 5 shows the third embodiment of the present invention. In the case of the third embodiment, a support plate 30 is disposed at the back of a plate-shaped yoke 29. The support plate 30 is arranged at the heat diffusion preventive vessel 16 through an opening formed in the side wall of the vessel 16 so as to be movable in the radius direction of the plasma diffusion chamber 12. The outside of the plasma diffusion chamber 12 does not contact the permanent magnet 17. The magnetic circuit section 27 is not suspended from the top wall of the heat diffusion preventive vessel 16. According to this structure, a heat conduction path from the plasma diffusion chamber 12 to the yoke 29 via the heat diffusion preventive vessel 16 is shorter than that of the first embodiment. However, because the yoke 29 is movable in the diameter direction, the bucket magnetic field 26 with an optional magnetic-field intensity (shown in FIG. 2) can be generated in the plasma diffusion chamber 12. Therefore, the third embodiment makes it possible to independently control the temperature of the plasma diffusion chamber 12 and the temperature of the permanent magnet 17 and to optionally set the intensity of the bucket magnetic field 26 generated by the permanent magnet 17. Further, this embodiment also makes it possible to reduce the temperature rise of the permanent magnet 17 due to heat radiation by forming a film for reflecting infrared radiation to the surface of the rod-shaped permanent magnet 17.

Figure 6:
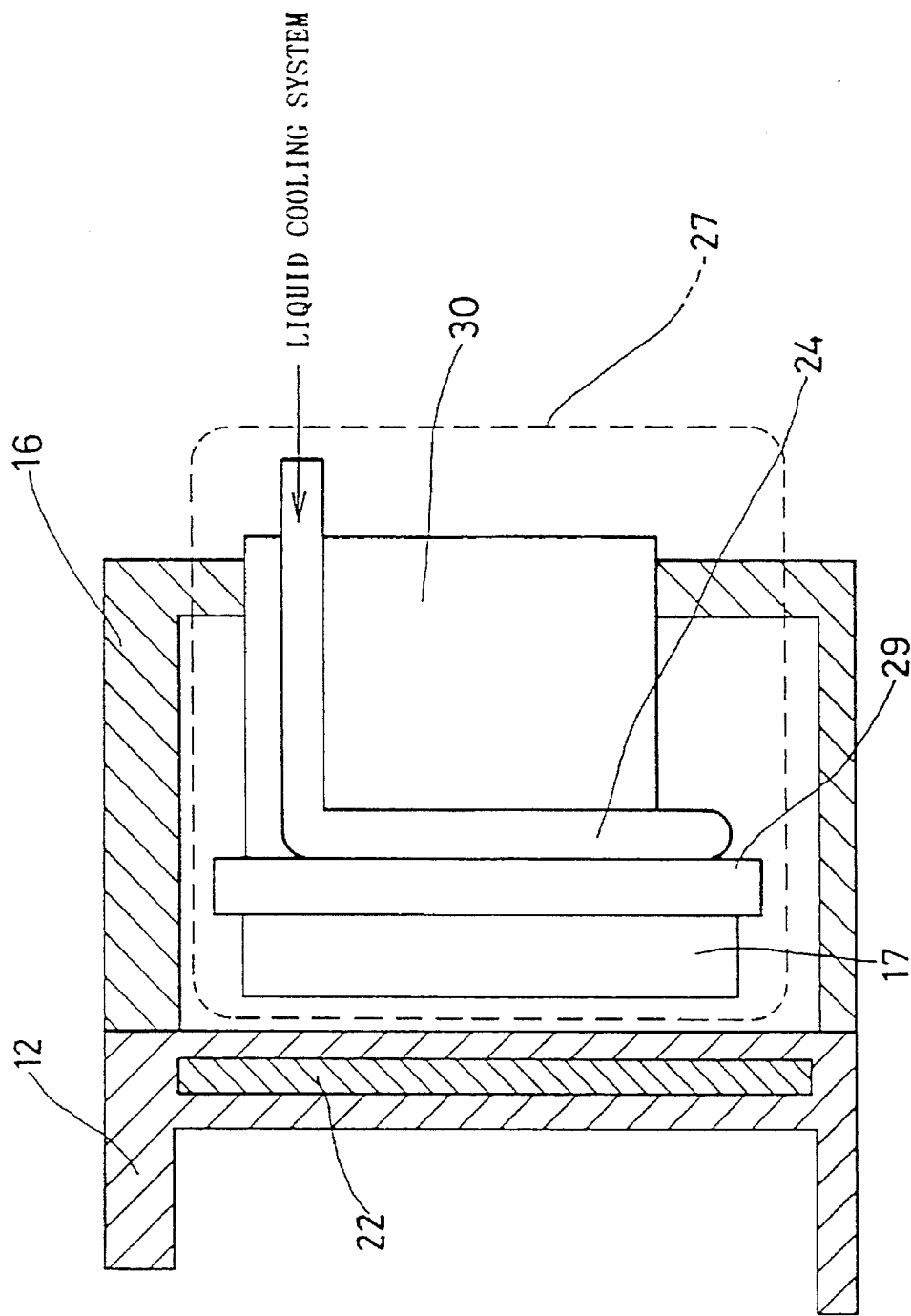
FIG. 6 is a longitudinal section of an essential portion similar to FIG. 3, showing a fourth embodiment of the present invention.

FIG. 6 shows the fourth embodiment of the present invention. The fourth embodiment has a structure in which there is no gap between the plasma diffusion chamber 12 and the heat diffusion preventive vessel 16, the internal space of the heat diffusion preventive vessel 16 is completely sealed, and heat does not escape from the heat diffusion preventive vessel 16 at all due to air convection. According to the structure of the fourth embodiment, it is possible to reduce the heat loss in heating the plasma diffusion chamber 12 and therefore efficiently heat the plasma diffusion chamber 12. Further, by setting the pressure of the inner space of the heat diffusion preventive vessel 16 to $10^{-3}$ Tort or lower, it is possible to reduce the heat loss in the plasma diffusion chamber 12 due to air convention and efficiently heat the plasma diffusion chamber 12. Therefore, in the case of the fourth embodiment, heat is transferred from the plasma diffusion chamber 12 to the rod-shaped permanent magnets 17 substantially by only heat radiation.

According to the fourth embodiment, it is also possible to independently control the temperature of the plasma diffusion chamber 12 and the temperature of the permanent magnets 17 similarly to the cases of the first to third embodiments. Further, by forming a film for reflecting infrared radiation on the surface of the rod-shaped permanent magnets 17, it is possible to keep the temperature of the rod-shaped permanent magnets 17 from rising due to heat radiation.

Figure 7:
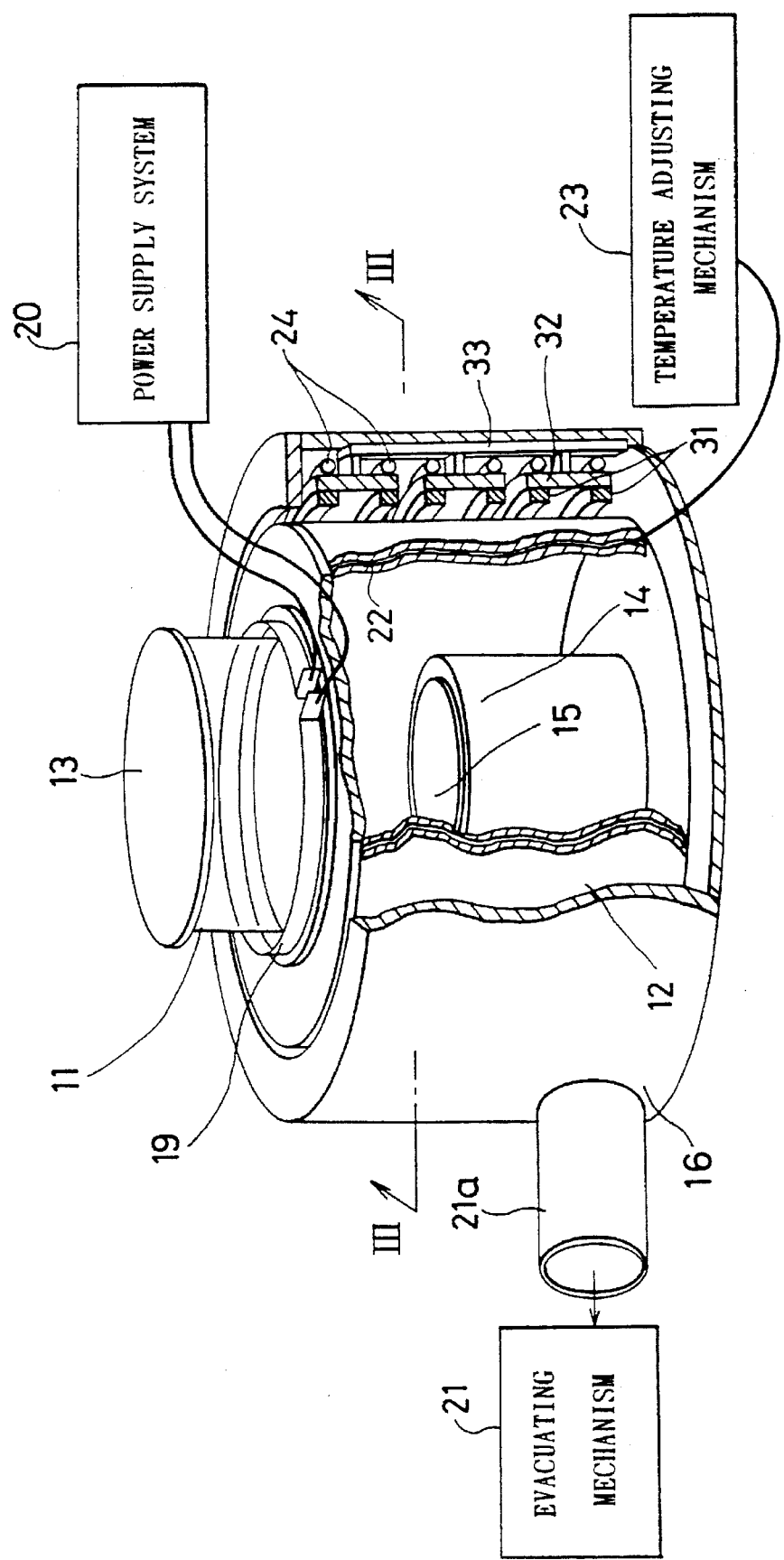
FIG. 7 is a partially cut-out external perspective view showing a fifth embodiment of the present invention.
Figure 8:
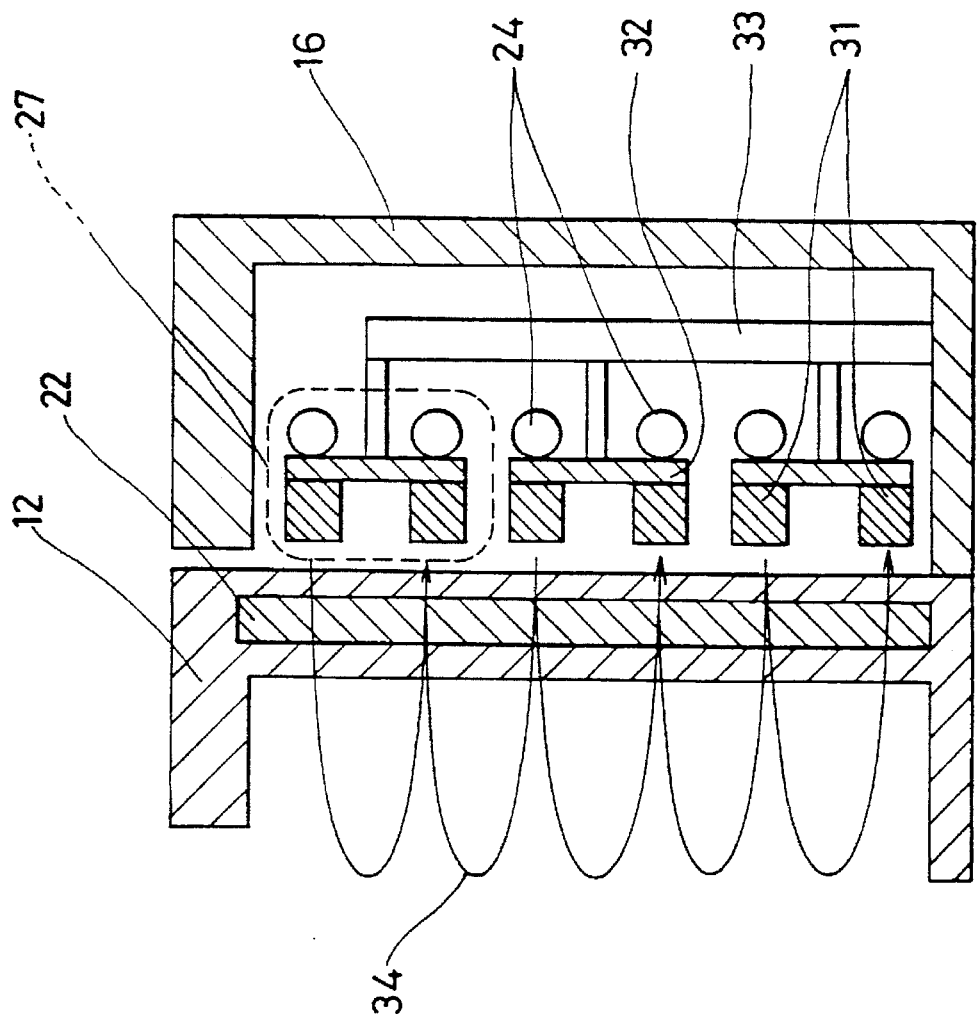
FIG. 8 is a sectional view of a line III—III in FIG. 7 showing a figure similar to FIG. 3 in the case of the fifth embodiment.
Figure 9:
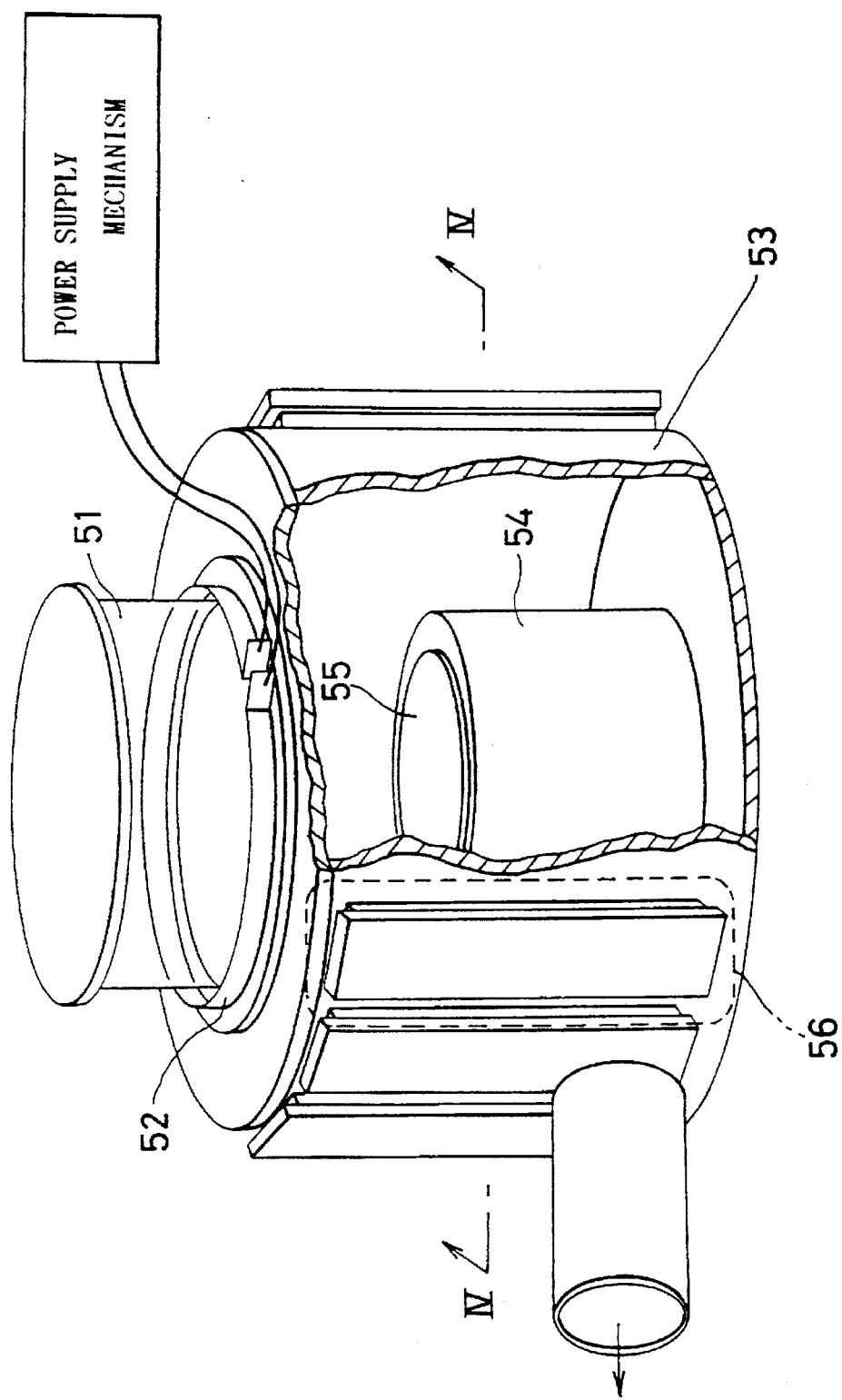
FIG. 9 is a partially cut-out external perspective view showing a conventional plasma processing apparatus.
Figure 10:
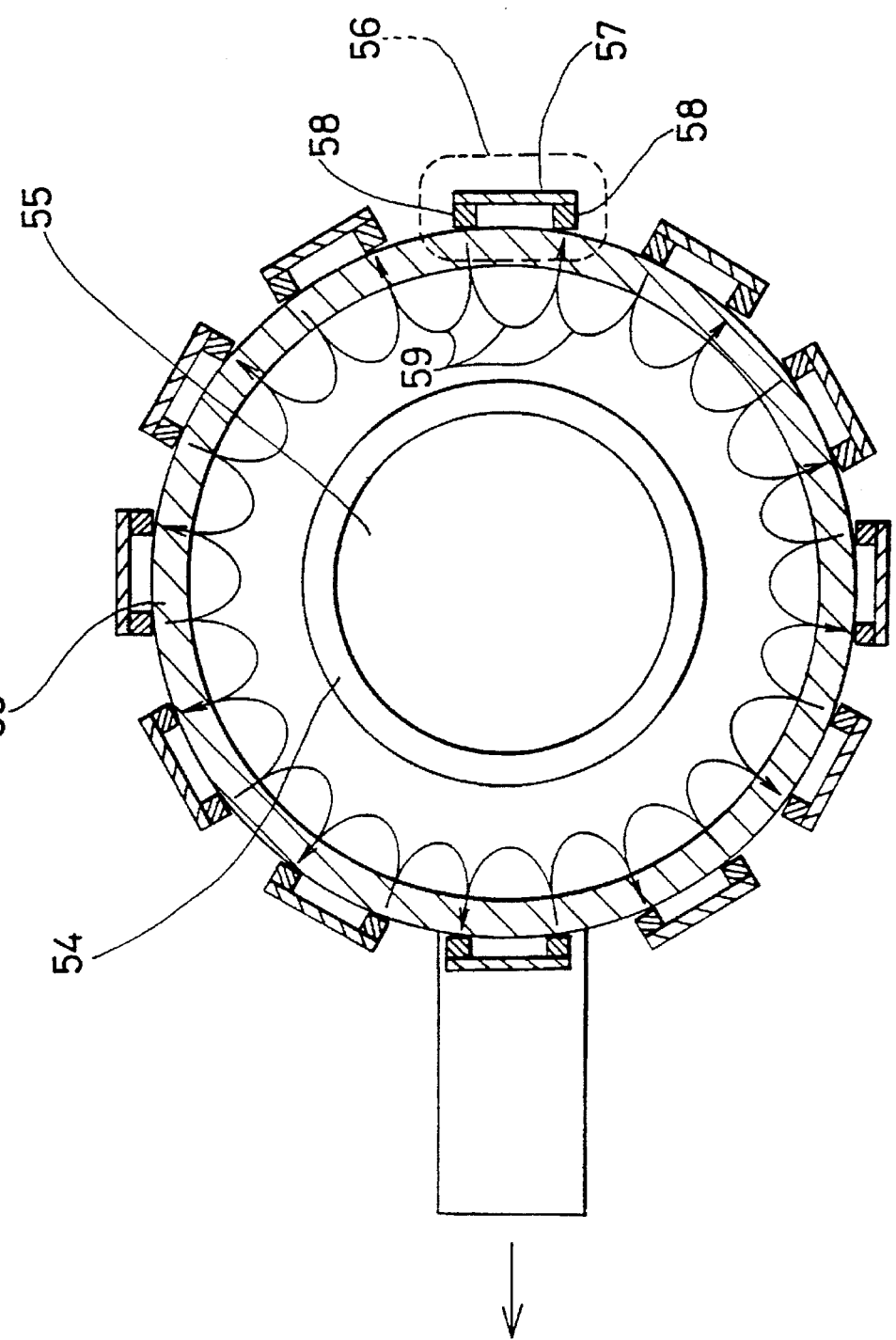
FIG. 10 is a sectional view of a line IV—IV in FIG. 9.

FIGS. 7 and 8 show the fifth embodiment of the present invention. The fifth embodiment has a structure for generating a ring cusped magnetic field in the plasma diffusion chamber 12 along the internal surface thereof. In FIGS. 7 and 8, elements substantially the same as the elements described in the above embodiments are respectively provided with the same symbol. In the case of the fifth embodiment, the plasma diffusion chamber 12 made of aluminum is provided with the heat diffusion preventive vessel 16 made of stainless steel in order to keep the heat of the heated plasma diffusion chamber 12 from escaping to the outside due to convection. Two annular permanent magnets 31 are cooled by the liquid cooling pipe 24 in which the coolant flows arranged on the back of an annular yoke 32.

In the case of the fifth embodiment, a plurality of annular permanent magnets 31 are arranged in the central axis direction of the plasma diffusion chamber 12, so that the central axes of the annular permanent magnets coincide with the central axis of the plasma diffusion chamber 12. As shown in FIG. 8, the magnetic circuit section 27 comprises the two annular permanent magnets 31 secured to the annular yoke 32. Each magnetic circuit section 27 is supported by a support member 33 secured to the bottom wall of the heat diffusion preventive vessel 16 so as to form a structure in which the outside of the plasma diffusion chamber 12 does not contact the permanent magnets 31 similarly to the cases of the above embodiments. The annular permanent magnet 31 generates a magnetic field 34 referred to as "a ring cusped magnetic field" nearby the inner wall-surface of the plasma diffusion chamber 12 along the inner-wall.

According to the fifth embodiment, it is possible to independently control the temperature of the plasma diffusion chamber 12 and the temperature of the annular permanent magnets 31 similarly to the cases of the above embodiments. Further, by adding the structure of the second embodiment to the fifth embodiment, it is possible to efficiently control the temperature of the plasma diffusion chamber 12 independently of the temperature of the permanent magnets 31. Furthermore, by forming a film for reflecting infrared radiation on the surface of the permanent magnets 31, it is possible to keep the temperature of the permanent magnets 31 from rising due to heat radiation. Though this embodiment uses the ring cusped magnetic field, it is a matter of course that other bucket magnetic fields such as a checkerboard-like magnetic field can be generated. The checkerboard-like magnetic field is defined as a magnetic field produced by a plurality of N and S magnetic pole pairs which are arranged like the squares of a checkerboard in alternating rows.

Each of the above embodiments uses aluminum with a high heat transfer coefficient as the material of the plasma diffusion chamber 12 and stainless steel with a low heat transfer coefficient as the material of the heat diffusion preventive vessel 16 in order to obtain uniformity of inner wall-surface temperature. However, it is needless to say that other appropriate material can be used. Further, though the above embodiments use only the heat diffusion preventive vessel 16 in order to efficiently heat the plasma diffusion chamber 12, it is also possible to increase the number of outer walls for more efficient heating. Furthermore, though the above embodiments use the cylindrical plasma diffusion chamber 12, it is a matter of course that advantages of this embodiment do not depend on the shape of the plasma diffusion chamber 12 to be heated.

What is claimed is:

1. A plasma processing apparatus comprising a plasma generating mechanism, a vacuum chamber for diffusing plasma generated by said plasma generating mechanism, a first temperature adjusting mechanism for adjusting a temperature of said vacuum chamber, a magnetic field generating mechanism for generating a magnetic field along an inner surface of said vacuum chamber which includes permanent magnets and a magnetic path, an evacuating mechanism for reducing an inside pressure of said vacuum chamber, a gas introducing mechanism for introducing gas into said vacuum chamber, and a substrate holding mechanism arranged in said vacuum chamber, further comprising:

a heat insulating portion formed between said permanent magnets and said vacuum chamber; and a second temperature adjusting mechanism for adjusting a temperature of said permanent magnets;

wherein the temperature adjusting of said vacuum chamber by said first temperature adjusting mechanism is independent of the temperature adjusting of said permanent magnets by said second temperature adjusting mechanism.

2. A plasma processing apparatus as claimed in claim 1, wherein the temperature of said permanent magnets is lower than the temperature of said vacuum chamber.

3. A plasma processing apparatus as claimed in claim 1, wherein another heat insulating portion is formed between a mechanism for securing said magnetic field generating mechanism and said vacuum chamber.

4. A plasma processing apparatus as claimed in claim 1, wherein said magnetic field generating mechanism is arranged in a heat diffusion preventive vessel provided around said vacuum chamber and is secured without contacting said vacuum chamber.

5. A plasma processing apparatus as claimed in claim 4, wherein the internal pressure of said heat diffusion preventive vessel is reduced.

6. A plasma processing apparatus as claimed in claim 1, wherein said permanent magnets included in said magnetic field generating mechanism are covered with a film for reflecting infrared radiation.

* * * * *